United States Patent
Botker et al.

(10) Patent No.: US 7,567,121 B1
(45) Date of Patent: Jul. 28, 2009

(54) CURRENT-MODE INSTRUMENTATION AMPLIFIER ERROR REDUCTION CIRCUIT AND METHOD

(75) Inventors: Thomas L. Botker, Andover, MA (US); Benjamin A. Douts, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 35 days.

(21) Appl. No.: 12/074,606

(22) Filed: Mar. 4, 2008

(51) Int. Cl.
*H03F 1/02* (2006.01)
*H03F 3/45* (2006.01)

(52) U.S. Cl. .......................... 330/9; 330/252
(58) Field of Classification Search .............. 330/9, 330/10, 252, 253; 327/124, 307
See application file for complete search history.

(56) References Cited

U.S. PATENT DOCUMENTS 6,538,503 B2 * 3/2003 Burt .............................. 330/9

OTHER PUBLICATIONS

Burr-Brown Products From Texas Instruments; "Precision, Rail-to-Rail I/O Instrumentation Amplifier"; INA326; INA327; SB0S222D-Nov. 2001-Revised Nov. 2004; 23 pp.

Analog Devices; "Micropower Precision CMOS Operational Amplifier"; AD8500; Rev. B; 2006-2009; pp. 1-12.
Analog Devices; "1.8V to 5V Auto-Zero, IN-AMP With Shutdown"; AD8553; Rev. O; 2005; pp. 1-20.
Analog Devices; 1.8V to 5 V Auto-Zero, IN-AMP With Shutdown; AD8563; Rev. PrA; 2006; pp. 1-15.

* cited by examiner

*Primary Examiner*—Robert Pascal
*Assistant Examiner*—Khiem D Nguyen
(74) *Attorney, Agent, or Firm*—Koppel, Patrick, Heybl & Dawson

(57) ABSTRACT

A current-mode instrumentation amplifier (IA) error reduction circuit and method employs a current-mode IA topology and an auto-zero circuit. The IA receives a differential voltage (VINP–VINN) and produces differential DC currents ($I_{DC1}$, $I_{DC2}$) in response, which are summed to produce the amplifier's output current. Ideally, when VINP=VINN, $I_{DC1}$ and $I_{DC2}$ will be equal; however, due to mismatches an error component $I_{error}$ will be present such that $I_{DC1}=I_{DC2}\pm I_{error}$. The auto-zero circuit is employed to reduce the magnitude of $I_{error}$. In operation, in an 'auto-zero mode', VINP and VINN are connected together and the auto-zero circuit operates to make $I_{DC1}=I_{DC2}$; a voltage needed to effect this is stored. Then, in 'normal mode', VINP and VINN are disconnected from each other and the IA is placed in the signal path, with the stored voltage acting to keep the magnitude of $I_{error}$ low.

13 Claims, 4 Drawing Sheets

CURRENT-MODE INSTRUMENTATION AMPLIFIER ERROR REDUCTION CIRCUIT AND METHOD

BACKGROUND OF THE INVENTION

1. Field of the Invention

This invention relates to the field of instrumentation amplifiers, and particularly to error reduction techniques for use with current-mode instrumentation amplifiers.

2. Description of the Related Art

An instrumentation amplifier (IA) is a type of amplifier that has been specifically designed to have characteristics suitable for use in measurement and test equipment, such as low DC offset, high common mode rejection (CMR), and high input impedance. Such an amplifier is typically used when a user needs to look at a differential signal in the presence of a common mode signal, which can often be larger than the differential signal of interest.

One possible IA topology, described in co-pending patent application Ser. No. 11/154,135 assigned to the present assignee, is shown in FIG. 1. This current-mode topology includes differential input terminals VINP and VINN which receive a differential voltage VINP–VINN and are coupled to the input nodes 20, 22 of first and second buffer amplifiers 24, 26, respectively. Buffer amps 24 and 26 produce respective output voltages V1 and V2 at respective output nodes 28, 30, which vary with VINP and VINN. Buffer amp 24 includes a transistor MN1 biased with a bias current $I_{bias1}=I3-I1$ (provided by current sources 32 and 34, respectively) and connected between V1 and a circuit common point 35, and buffer amp 26 includes a transistor MN2 biased with a bias current $I_{bias2}=I4-I2$ (provided by current sources 36 and 38, respectively) and connected between V2 and the circuit common point.

A resistor 39 having a resistance R1 is connected between nodes 28 and 30 such that it conducts a current $I_{R1}$ that varies with VINP–VINN. When so arranged, MN1 conducts a current $I_a=I_{bias1}-I_{R1}$ when VINP>VINN and a current $I_a=I_{bias1}+I_{R1}$ when VINP<VINN, and MN2 conducts a current $I_b=I_{bias2}-I_{R1}$ when VINN>VINP and a current $I_b=I_{bias2}+I_{R1}$ when VINN<VINP. Circuitry (here, MN3 and MN4) is provided which couples current $I_a$ to the current input terminal 40 of a current mirror 42, and couples current $I_b$ to the mirror's current output terminal 46—which also serves as the IA's current output node. A buffer amplifier 55 coupled at its inverting input to current output node 46 provides the IA's output voltage $V_{out}$. The non-inverting input of buffer amplifier 55 would typically be connected to a voltage source 56 which provides a reference voltage $V_{ref}$, and a feedback path between its output and inverting input preferably includes components such as R2 and C2, to control the amplifier's gain and/or stability.

To minimize DC mismatch errors, the IA shown in FIG. 1 is preferably chopper-stabilized, with typically both the buffer amplifiers (using switches 60a and 60b) and signal current paths (using switches 64a and 64b) chopped using a two-phase chopping cycle. However, though chopping gives the IA a low average offset voltage, it also induces an output voltage rippled caused by the chopped currents. The chopping of the buffer amplifiers also results in a gain error due to capacitive charging and discharging.

SUMMARY OF THE INVENTION

A current-mode IA error reduction circuit and method are presented which overcome the problems noted above, enabling the amplifier to provide a highly accurate output without the voltage ripple and gain errors associated with a chopper-stabilized topology.

The present IA employs a current-mode IA topology and an auto-zero circuit; the invention can be used with a variety of current-mode IA topologies. A current-mode IA receives a differential voltage (VINP–VINN) and produces differential DC currents ($I_{DC1}$, $I_{DC2}$) that vary with VINP–VINN; $I_{DC1}$ and $I_{DC2}$ are summed to produce the amplifier's output current. Ideally, when VINP=VINN, $I_{DC1}$ and $I_{DC2}$ will be equal. However, due to mismatches between the circuits producing $I_{DC1}$ and $I_{DC2}$, an error component $I_{error}$ will be present such that when VINP=VINN, $I_{DC1}=I_{DC2}\pm I_{error}$. An auto-zero circuit is employed to make the magnitude of $I_{error}$ less than it would be otherwise.

In a preferred embodiment, the IA comprises first and second buffer amplifiers which receive VINP and VINN and produce output voltages V1 and V2 in response. A resistance element is connected between V1 and V2 such that it conducts a current $I_{R1}$ which varies with V1-V2. Circuitry is provided which produces current $I_{DC1}$ such that it varies with V1 and $I_{R1}$, and current $I_{DC2}$ such that it varies with V2 and $I_{R1}$. The IA is put into an 'auto-zero mode', during which VINP and VINN are connected together and the auto-zero circuit produces outputs needed to make $I_{DC1}=I_{DC2}$; a voltage needed to effect this is stored. The IA is then operated in its 'normal mode': VINP and VINN are disconnected from each other and the IA is placed in the signal path, with the stored voltage acting to keep the magnitude of $I_{error}$ low. The present error reduction circuit may be used alone, or in conjunction with chopper and/or additional auto-zero techniques.

Further features and advantages of the invention will be apparent to those skilled in the art from the following detailed description, taken together with the accompanying drawings.

DETAILED DESCRIPTION OF THE INVENTION

Figure 1:
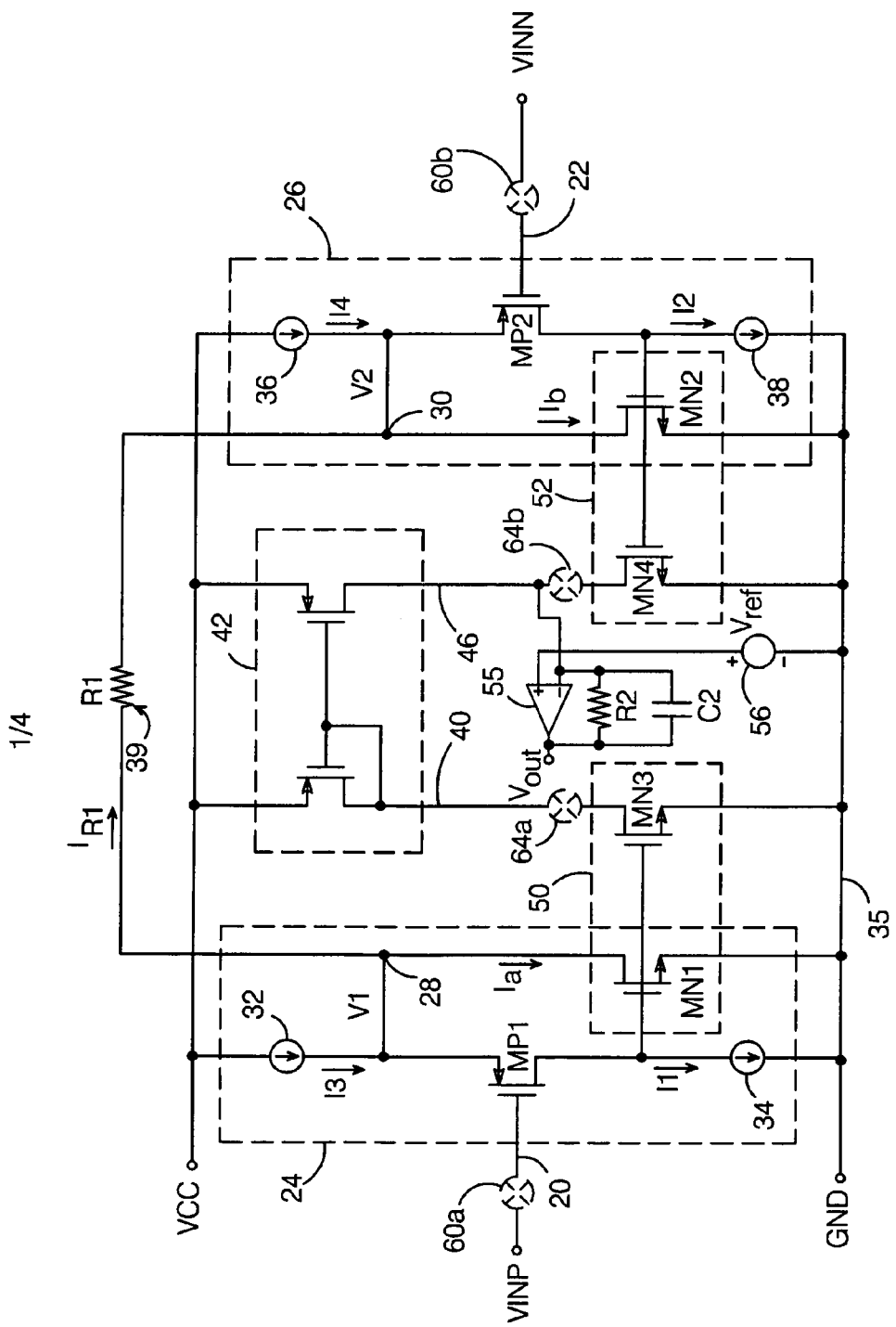
FIG. 1 is a schematic diagram of a known current-mode IA.
Figure 2:
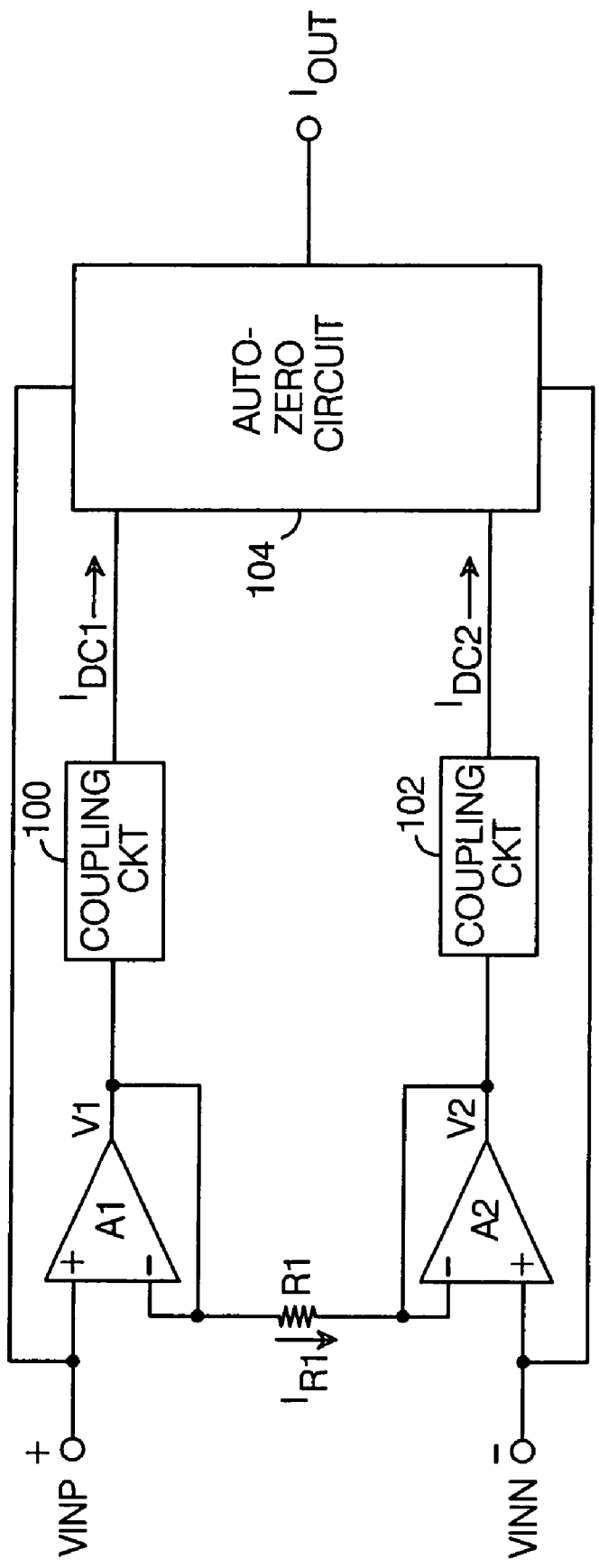
FIG. 2 is a block diagram of a current-mode IA with an error correction circuit per the present invention.

The basic principles of the present current-mode IA with error correction circuit are illustrated in FIG. 2. The current-mode IA includes first and second buffer amplifiers A1 and A2, which produce output voltages V1 and V2, respectively. A resistance element having a value R1 is connected between V1 and V2 such that it conducts a current $I_{R1}$ which varies with V1-V2. Coupling circuits 100 and 102, which may take the form of current mirrors or virtual ground amplifiers, for example, are provided which produce a DC current $I_{DC1}$ that varies with V1 and $I_{R1}$, and a DC current $I_{DC2}$ that varies with V2 and $I_{R1}$, respectively.

In a conventional current-mode IA, currents $I_{DC1}$ and $I_{DC2}$ are summed to produce a single-ended output current $I_{out}$. However, as noted above, mismatches between the components of buffer amplifiers A1 and A2 and coupling circuits 100 and 102 can give rise to an error component $I_{error}$ in $I_{out}$.

This error is mitigated in the present invention with the use of an auto-zero circuit 104. When the IA is placed in an 'auto-zero mode', the auto-zero circuit, which typically includes a switching network, connects inputs VINN and VINP together so that VINN=VINP. It then generates outputs as needed to force $I_{DC1}=I_{DC2}$ when VINN=VINP, with the voltage required to effect this correction stored. The IA is then placed in 'normal mode': VINP and VINN are disconnected from each other and the IA is placed in the signal path. Now, the stored voltage acts to reduce the magnitude of $I_{error}$ in $I_{out}$ during normal operation.

Figure 3:
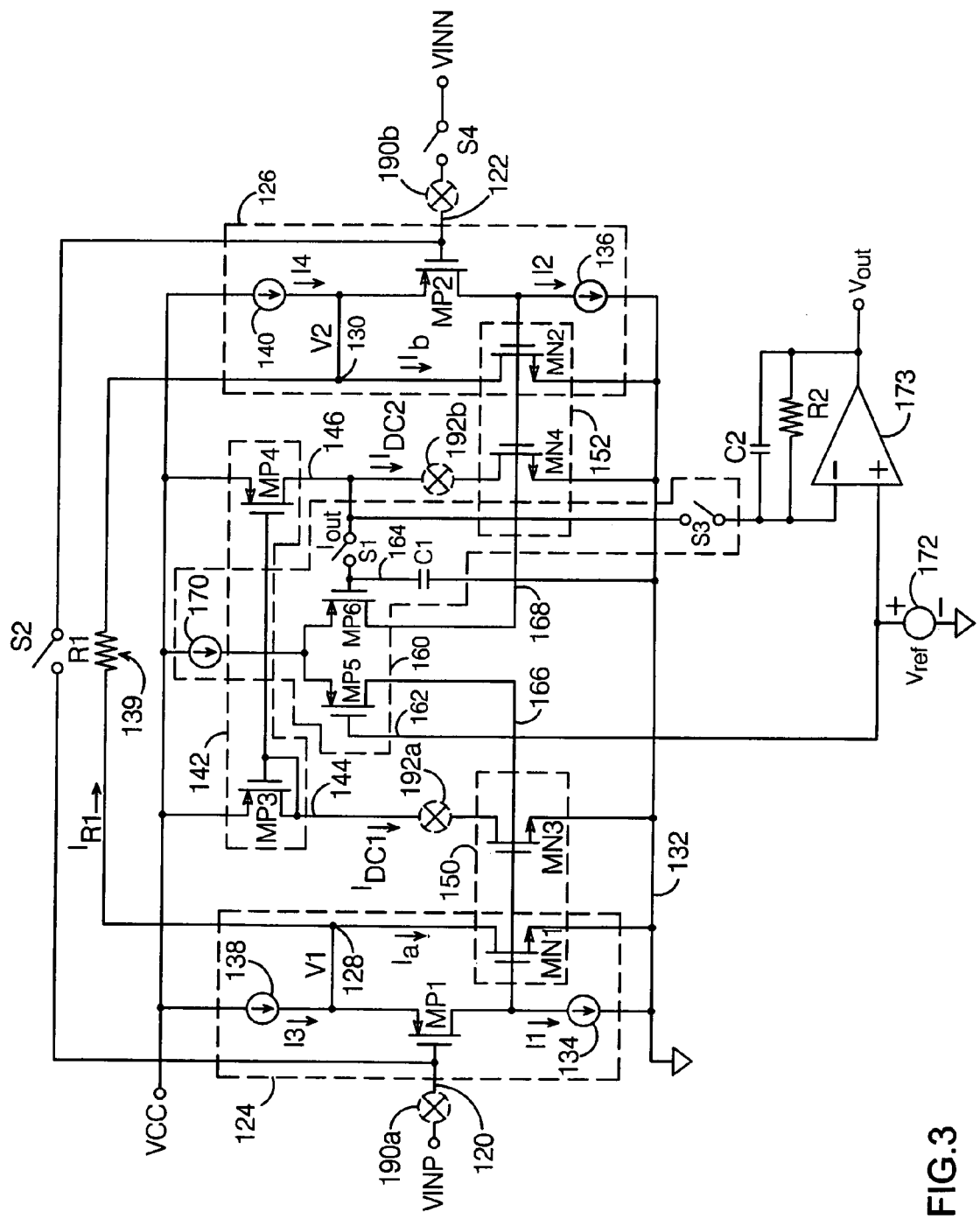
FIG. 3 is a schematic diagram of one possible embodiment of a current-mode IA with an error correction circuit per the present invention.

The present error reduction circuit could be used with many types of current-mode IA topologies. One possible implementation is shown in FIG. 3. The IA includes differential input terminals VINP and VINN which receive a differential voltage $V_{in}$=VINP−VINN, which are coupled to the input nodes 120, 122 of first and second buffer amplifiers 124, 126, respectively. Buffer amps 124 and 126 produce respective output voltages V1 and V2 at respective output nodes 128, 130. Buffer amp 124 includes a transistor MN1 connected between output node 128 and a circuit common point 132, and buffer amp 126 includes a transistor MN2 connected between output node 130 and circuit common point 132. Note that, though the transistors depicted in the exemplary embodiments described herein are shown as field-effect transistors (FETs), the invention could also be realized with bipolar transistors, as well as with opposite polarity implementations.

In a typical implementation, input nodes 120 and 122 would be connected to respective input FETs MP1 and MP2, with MP1 biased with a current source 134 which provides a bias current I1, and MP2 biased with a current source 136 which provides a bias current I2. Additional current sources 138 and 140 are connected as shown between a supply voltage (VCC) and nodes 128 and 130. Current sources 138 and 140 provide currents I3 and I4, respectively, such that FET MN1 is biased with a current $I_{bias1}$ approximately given by I3−I1, and FET MN2 is biased with a current $I_{bias2}$ approximately given by I4−I2.

A resistor 139 having a resistance R1 is connected between nodes 128 and 130. Since V1≈VINP and V2≈VINN, $V_{in}$ is replicated across R1, causing a current flow of (V1−V2)/R1=$I_{R1}$ in R1. When so arranged, FET MN1 conducts a current $I_a=I_{bias1}-I_{R1}$ when VINP>VINN and a current $I_a=I_{bias1}+I_{R1}$ when VINP<VINN, and FET MN2 conducts a current $I_b=I_{bias2}-I_{R1}$ when VINN>VINP and a current $I_b=I_{bias2}+I_{R1}$ when VINN<VINP.

A current mirror 142, here comprised of PMOS FETs MP3 and MP4, is arranged to mirror a current applied at a current input terminal 144 to a current output terminal 146, with current output terminal 146 being the IA's current output node. Circuitry 150 is arranged to couple current $I_a$ to the current input terminal of current mirror 142, and circuitry 152 couples current $I_b$ to the mirror's current output terminal. Here, circuitry 150 and 152 comprises FETs MN3 and MN4, respectively, which serve as mirror transistors that mirror $I_a$ and $I_b$ to current mirror terminals 144 and 146, respectively. The DC current conducted by MN3 and mirrored to current output terminal 146 is referred to herein as $I_{DC1}$, and the DC current conducted by MN4 which is connected to current output terminal 146 is referred to herein as $I_{DC2}$. The DC current provided at current output terminal 146 is $I_{out}$, which is given by $I_{DC1}-I_{DC2}$ (assuming a 1:1 ratio for current mirror 142).

As noted above, an auto-zero circuit is employed to reduce errors in $I_{out}$ that might otherwise arise due to mismatches between buffer amps 124 and 126, coupling circuits 150 and 152, and/or in current mirror 142. In this example, an auto-zero circuit 160 comprises PMOS FETs MP5 and MP6 connected as a differential pair, having respective inputs 162, 164 and outputs 166, 168 and biased with a current source 170. A voltage source 172 provides a reference voltage $V_{ref}$, which is coupled to the gate of MP5, and a capacitor C1 is coupled to the gate of MP6.

The auto-circuit also includes a switching network arranged to operate the IA in an auto-zero mode and a normal mode. In this example, the switching network comprises a switch S1 connected between pair input 164 and current output terminal 146, a switch S2 connected between input nodes 120 and 122, a switch S3 connected in series with current output terminal 146, and a switch S4 connected between VINN and input node 122. When the IA is to be operated in auto-zero mode, the switching network is arranged to:

connect differential pair input 164 to current output terminal 146 by closing S1;

connect input nodes 120 and 122 together by closing S2; and open S3 and S4.

With S1 and S2 closed, the circuit is essentially an op amp in a unity-gain configuration, with the output of the amplifier (146) tied directly to the inverting input (gate of MP6). As in a typical op amp with negative feedback, the inputs (gates of MP5 and MP6) will be driven to approximately the same voltage—i.e., $V_{ref}$—by the feedback mechanism. For example, if current source 136 causes MN4 to demand more current than MP4 is supplying, the voltage at the drain of MN4 will be pulled down. This will cause more current to flow through MP6, thus satisfying some of the extra demand of current source 136. This will continue until the current from MP6 supplies all the excess current demanded by current source 136, meaning the current from MP6 plus the current from MP4 matches the current demanded by current source 136. Therefore, the drain of MN4 will not be pulled high or low by a current mismatch, and it can be balanced at a voltage equal to $V_{ref}$. This has the effect of making $I_{DC1}=I_{DC2}$ when VINN=VINP, which is the desired error correction condition. The correction voltage at the gate of MP6 required to effect the equality is stored on C1.

When the correction voltage has been stored on C1, the IA can then be operated in normal mode, in which case the switching network is arranged to:

uncouple pair input 164 from current output terminal 146 by opening S1;

disconnect input node 120 from input node 122 by opening S2; and closing S3, which preferably connects current output terminal 146 to the non-inverting input of a buffer amplifier 173, and closing S4 which connects VINN to input node 122. This places the IA into the signal path, and buffer amplifier 173 produces an output voltage $V_{out}$ that varies with $I_{out}$. However, now, with the correction voltage stored on C1 causing the voltage at current output terminal 146 to be maintained at Vref, the magnitude of $I_{error}$ in $I_{out}$ is less than it otherwise be. Buffer amplifier 173 may include components such as R2 and C2 in its feedback path, to control its gain and/or stability.

Use of an auto-zero circuit as described above acts to mitigate or eliminate errors from a number of potential sources. For example, the auto-zero circuit would reduce the impact of mismatches between current sources 134,136, and/or 138,140. It would also correct other current errors, such as current lost to the substrate by MN1 or MN2 due to impact ionization. It could also be used to reduce input errors that arise from a mismatch between MP1 and MP2; here, the auto-zero process would proceed with R1 in the circuit as opposed to having R1 removed. In addition, non-chopped IAs that employ the auto-zero circuit avoid the gain error that can arise from the chopping of the buffer amplifiers due to capacitive charging and discharging.

Further error reduction could be realized if the IA is chopper-stabilized. For example, input FETs MP1 and MP2 could be chopped using optional switches 190a, 190b, and the connections to current mirror 142 could be chopped using optional switches 192a, 192b. When chopper-stabilized, the IA is operated in accordance with a two-phase chopping cycle, with amplifiers 124 and 126, and the signal current paths between the amplifiers and the current mirror, exchanging places between phases.

Note that circuit common point 132 is shown as being "ground", but this is not essential; other fixed voltages might also be used.

For the $I_a$ and $I_b$ equations noted above to be correct, I3 should be greater than I1 and I4 should be greater than I2, such that an input signal current applied to MN1 or MN2 appears as a small signal.

To further reduce DC mismatch errors, current mirror 142 can be implemented as a chopped mirror and/or as a cascoded mirror (not shown); this technique is described in detail in co-pending patent application Ser. No. 11/154,136 assigned to the present assignee. Note that, if implemented as a chopped mirror, the chopping frequency used for mirror 142 should be different than that used for switches 190a/190b and 192a/192b, to ensure that errors that might otherwise arise due to mismatch between the mirror's transistors are cancelled.

Figure 4:
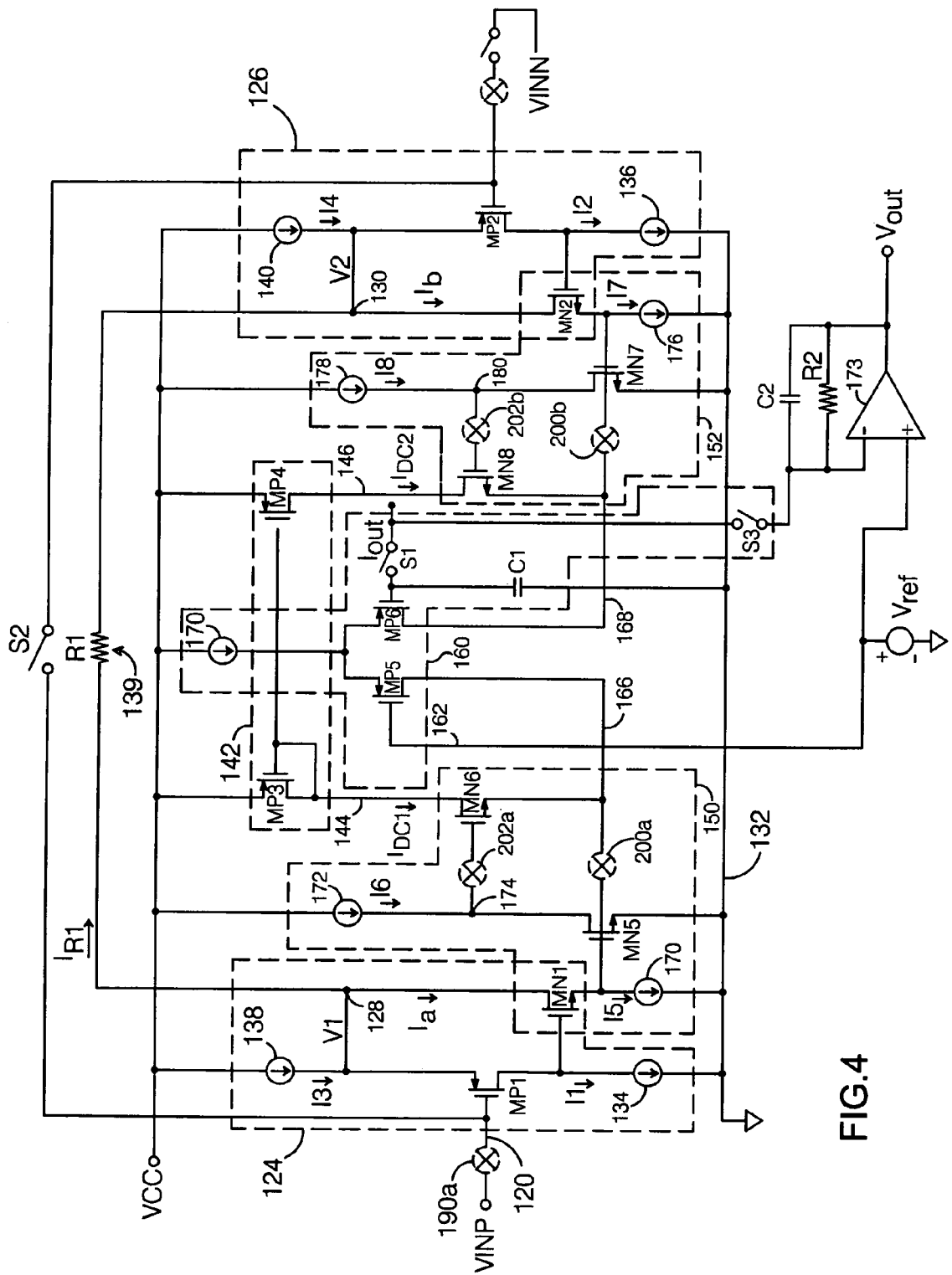
FIG. 4 is a schematic diagram of another possible embodiment of a current-mode IA with an error correction circuit per the present invention.

Another possible embodiment of an IA with an error correction circuit in accordance with the present invention is shown in FIG. 4. This implementation is similar to that of FIG. 3, except for the realization of current coupling circuitry 150 and 152. Here, circuitry 150 includes current sources 170 and 172 and FETs MN5 and MN6. Current source 170 provides a current I5 and is connected between the source of MN1 and circuit common point 132. Current source 172 provides a current I6 and is connected between supply voltage VCC and a node 174. FET MN5 has its gate coupled to the source of MN1, its source connected to circuit common point 132, and its drain connected to node 174, and FET MN6 has its gate coupled to node 174, its source coupled to the gate of MN5, and its drain connected to the current input node 144 of current mirror 142.

Similarly, circuitry 152 includes current sources 176 and 178 and FETs MN7 and MN8. Current source 176 provides a current I7 and is connected between the source of MN2 and circuit common point 132. Current source 178 provides a current I8 and is connected between supply voltage VCC and a node 180. FET MN7 has its gate coupled to the source of MN2, its source connected to circuit common point 132, and its drain connected to node 180, and FET MN8 has its gate coupled to node 180, its source coupled to the gate of MN7, and its drain connected to the current output node 146 of current mirror 142.

When so arranged, MN5/MN6 and MN7/MN8 form virtual ground nodes that fold the currents in MN1 and MN2 around to current output node 146, with the MN1 current conveyed to node 146 via current mirror 142. When VINP is positive with respect to VINN, the current in MN6 increases by $V_{in}/R1$ while the current in MN8 decreases by the same amount; the opposite occurs when VINN is positive with respect to VINP. Currents I5 and I7 are fixed such that, when $I_{R1} \neq 0$, the difference between I5 and $I_a$ must be provided by MN6 and mirrored to current output node 146, and the difference between I7 and $I_b$ is conducted to current output node 146 by MN8. FET MN5 and current source 172 act to stabilize the node voltage at the gate of MN5 and source of MN6, and FET MN7 and current source 178 stabilize the node voltage at the gate of MN7 and source of MN8.

For the $I_a$ and $I_b$ equations noted above to be correct for this embodiment, I3 should be greater than I1 and I4 should be greater than I2, such that an input signal applied to MN1 or MN2 appears as a small signal. For best performance, I5 should be greater than $I_{bias1}$, and I7 should be greater than $I_{bias2}$, such that signal currents in MN6 and MN8 appear as small signals.

As in FIG. 3, buffer amplifier 173 may include components such as R2 and C2 in its feedback path, to control its gain and/or stability. When arranged as shown, when S3 is closed, buffer amplifier 173 wants to force the voltage at the drain of MN8 to $V_{ref}$ through its own feedback mechanism. It does this by removing or injecting any excess current from the drain node of MN8 and channeling it through R2. When the MP4 and MN8 currents are "balanced" such that the voltage at the drain of MN8 is $V_{ref}$, buffer amplifier 173 symbol does not have to add or remove any current to get that voltage to $V_{ref}$. Therefore, there is no current through R2, and node $V_{out}$ is at a potential equal to $V_{ref}$.

As with the embodiment shown in FIG. 3, the IA shown in FIG. 4 can be chopper stabilized to eliminate DC mismatch errors. This can be implemented with switches 190a and 190b connected between input nodes 120 and 122 and VINP and VINN, respectively, a switch 200a connected between the source of MN6 and the gate of MN5, a switch 200b connected between the source of MN8 and the gate of MN7, a switch 202a connected between the gate of MN6 and node 174, and a switch 202b connected between the gate of MN8 and node 180, such that both the buffer amplifiers and the signal current paths are chopped. Amplifiers 124 and 126 exchange positions during the first and second chopping phases, thereby enabling DC mismatches within the amplifiers and the current sources to be largely eliminated. As with the embodiment shown in FIG. 3, DC mismatch errors can be further reduced by implementing current mirror 142 as a chopped mirror, and/or as a cascoded mirror (not shown).

An advantage of this topology is that parasitic capacitance on output nodes 128 and 130 does not cause a degradation in CMR versus frequency. As common mode input voltage increases, the parasitic capacitances need to be charged. As a result, the currents in MN6 and MN8 will increase. But, if the capacitances are balanced, the amount that the MN6 current changes will match the change in MN8, thereby providing a good CMR versus frequency characteristic.

Note that a current-mode IA as described herein might be used in conjunction with a second IA, with one used to drive the signal path while the other is auto-zeroed.

The current-mode IA implementations shown in FIGS. 2-4 are merely exemplary. As previously noted, the present error correction circuit could be employed with any current-mode IA featuring the basic two buffer amp/resistance/current coupling circuitry described herein.

While particular embodiments of the invention have been shown and described, numerous variations and alternate embodiments will occur to those skilled in the art. Accordingly, it is intended that the invention be limited only in terms of the appended claims.

We claim:

1. A current-mode instrumentation amplifier (IA), comprising:
   first and second input terminals connected to receive a differential voltage (VINP−VINN);
   a first resistance element;
   first and second buffer amplifiers having respective input nodes coupled to respective ones of said input terminals and respective output nodes providing first and second output voltages V1 and V2 which vary with VINP and VINN, respectively, said first resistance element connected at a first terminal to said first output node and at a second terminal to said second output node such that said first resistance element conducts a current $I_{R1}$ which varies with V1-V2;

a first circuit which produces a DC output current $I_{DC1}$ which varies with V1 and $I_{R1}$;

a second circuit which produces a DC output current $I_{DC2}$ which varies with V2 and $I_{R1}$; said IA arranged such that when VINP=VINN, $I_{DC1}=I_{DC2}\pm I_{error}$, where $I_{error}$ arises due to mismatches between said first and second buffer amplifiers and/or said first and second circuits; and an auto-zero network arranged to reduce $I_{error}$ such that the magnitude of $I_{error}$ is less than it would be without said auto-zero network.

2. The IA of claim 1, wherein said first and second circuits are virtual ground amplifiers.

3. The IA of claim 1, further comprising a current mirror arranged to mirror a current applied at a current input terminal to a current output terminal, the current at said current output terminal being said IA's output current $I_{out}$, said current $I_{DC1}$ coupled to said current input terminal and mirrored to said current output terminal and said current $I_{DC2}$ coupled to said current output terminal.

4. The IA of claim 3, further comprising chopping circuitry arranged to chop said current input terminal and said current output terminal between $I_{DC1}$ and $I_{DC2}$.

5. The IA of claim 3, wherein said auto-zero network comprises:

first and second transistors connected as a differential pair having respective inputs and respective outputs;

a voltage source which provides a reference voltage $V_{ref}$, said first differential pair input coupled to $V_{ref}$;

a capacitor coupled to said second differential pair input, said differential pair producing first and second output currents coupled to nodes which vary with $I_{DC1}$ and $I_{DC2}$, respectively; and a switching network arranged to operate IA in an auto-zero mode and a normal mode, said switching network when in said auto-zero mode arranged to:

connect said first and second input terminals together; and couple said second differential pair input to said current output terminal;

said differential pair arranged to force the voltage at said current output terminal to $V_{ref}$, the voltage required at said second differential pair input to do so stored on said capacitor;

said switching network when in said normal mode arranged to:

uncouple said second differential pair input from said current output terminal and disconnect said first input terminal from said second input terminal such that $I_{DC1}$ and $I_{DC2}$ vary with VINP-VINN;

said voltage stored on said capacitor maintaining the voltage at said current output terminal at Vref when said IA is operating in normal mode such that the magnitude of $I_{error}$ is less than it would be without said stored voltage.

6. The IA of claim 3, further comprising a buffer amplifier having first and second inputs and an output, said buffer amplifier coupled to $V_{ref}$ at said first input, said switching network further arranged to:

couple said second differential pair input to said current output terminal during said normal mode such that said buffer amplifier provides an output voltage $V_{out}$ which varies with $I_{out}$; and uncouple said second differential pair input from said current output terminal during said auto-zero mode.

7. The IA of claim 3, wherein said first and second circuits comprise respective virtual ground nodes arranged to provide currents $I_{DC1}$ and $I_{DC2}$ to said current mirror terminals.

8. The IA of claim 1, further comprising chopping circuitry arranged to chop said first and second input terminals between VINP and VINN.

9. A current-mode instrumentation amplifier (IA), comprising:

first and second input terminals connected to receive a differential voltage (VINP−VINN);

a first resistance element having a resistance R1;

first and second buffer amplifiers having respective input nodes coupled to respective ones of said input terminals and respective output nodes providing first and second output voltages V1 and V2 which vary with VINP and VINN, respectively, said first amplifier including a first transistor (MN1) coupled between said first output node and a circuit common point and biased with a bias current $I_{bias1}$, and said second amplifier including a second transistor (MN2) coupled between said second output node and said circuit common point and biased with a bias current $I_{bias2}$;

said first resistance element connected between said first output node and said second output node such that said first resistance element conducts a current $I_{R1}$ which varies with V1-V2, said first transistor conducts a current $I_a=I_{bias1}-I_{R1}$ when VINP>VINN and a current $I_a=I_{bias1}+I_{R1}$ when VINP<VINN, and said second transistor conducts a current $I_b=I_{bias2}-I_{R1}$ when VINN>VINP and a current $I_b=I_{bias2}+I_{R1}$ when VINN<VINP;

a current mirror arranged to mirror a current applied at a current input terminal to a current output terminal, the current at said current output terminal being said IA's output current $I_{out}$;

a third transistor (MN3) connected to mirror current $I_a$ to the current input terminal of said current mirror, said mirrored current $I_a$ being a current $I_{DC1}$;

a fourth transistor (MN4) connected to mirror current $I_b$ to said current output terminal, said mirrored current $I_b$ being a current $I_{DC2}$; and an auto-zero network, comprising:

fifth and sixth transistors connected as a differential pair having respective inputs and respective outputs;

a voltage source which provides a reference voltage $V_{ref}$, a first one of said differential pair inputs coupled to $V_{ref}$;

a capacitor coupled to the second of said differential pair inputs, said differential pair producing first and second output currents coupled to the voltages driving said first and second transistors, respectively; and a switching network arranged to operate said IA in an auto-zero mode and a normal mode, said switching network when in said auto-zero mode arranged to:

connect said first and second input terminals together; and couple said second differential pair input to said current output terminal;

said differential pair arranged to force the voltage at said current output terminal to $V_{ref}$, the voltage required at said second differential pair input to do so stored on said capacitor;

said switching network when in said normal mode arranged to:
uncouple said second differential pair input from said current output terminal and disconnect said first input terminal from said second input terminal such that $I_{DC1}$ and $I_{DC2}$ vary with VINP−VINN;

said IA arranged such that when VINP=VINN, $I_{DC1}=I_{DC2}\pm I_{error}$, where $I_{error}$ arises due to mismatches between said first and second buffer amplifiers and/or said third and fourth transistors;

said voltage stored on said capacitor maintaining the voltage at said current output terminal at $\sim V_{ref}$ when said IA is operating in normal mode such that the magnitude of $I_{error}$ is less than it would be without said stored voltage.

10. The IA of claim 9, further comprising a buffer amplifier having first and second inputs and an output, said buffer amplifier coupled to $V_{ref}$ at said first input, said switching network further arranged to:
couple said second differential pair input to said current output terminal during said normal mode such that said buffer amplifier provides an output voltage $V_{out}$ which varies with $I_{out}$; and
uncouple said second differential pair input from said current output terminal during said auto-zero mode.

11. A current-mode instrumentation amplifier (IA), comprising:
first and second input terminals connected to receive a differential voltage (VINP−VINN);
a first resistance element having a resistance R1;
first and second buffer amplifiers having respective input nodes coupled to respective ones of said input terminals and respective output nodes providing first and second output voltages V1 and V2 which vary with VINP and VINN, respectively, said first amplifier including a first field-effect transistor (FET) (MN1) coupled between said first output node and a circuit common point and biased with a bias current $I_{bias1}$, and said second amplifier including a second FET (MN2) coupled between said second output node and said circuit common point and biased with a bias current $I_{bias2}$;
said first resistance element connected between said first and second output nodes such that said first resistance element conducts a current $I_{R1}$ which varies with V1-V2, said first FET conducts a current $I_a=I_{bias1}-I_{R1}$ when VINP>VINN and a current $I_a=I_{bias1}+I_{R1}$ when VINP<VINN, and said second FET conducts a current $I_b=I_{bias2}-I_{R1}$ when VINN>VINP and a current $I_b=I_{bias2}+I_{R1}$ when VINN<VINP;
a current mirror arranged to mirror a current applied at a current input terminal to a current output terminal, the current at said current output terminal being said IA's output current $I_{out}$;
circuitry arranged to couple current $I_a$ to the current input terminal of said current mirror, said circuitry comprising:
a first fixed current source connected between the source of said first FET and said circuit common point;
a third FET (MN5) having its gate coupled to the source of said first FET and its drain-source circuit connected between a second fixed current source and said circuit common point; and
a fourth FET (MN6) having its gate connected to the drain of said third FET and its drain-source circuit connected between said current mirror input terminal and the gate of said third FET, such that said third and fourth FETs form a virtual ground node which stabilizes the voltage at the gate of said third FET, and said fourth FET conducts a current $I_{DC1}$ which varies with current $I_a$; and circuitry arranged to couple current $I_b$ to said current output terminal, said circuitry comprising:
a third fixed current source connected between the source of said second FET and said circuit common point;
a fifth FET (MN7) having its gate coupled to the source of said second FET and its drain-source circuit connected between a fourth fixed current source and said circuit common point; and
a sixth FET (MN8) having its gate connected to the drain of said fifth FET and its drain-source circuit connected between said current output terminal and the gate of said fifth FET, such that said fifth and sixth FETs form a virtual ground node which stabilizes the voltage at the gate of said fifth FET and said sixth FET conducts a current $I_{DC2}$ which varies with current $I_b$; and an auto-zero network, comprising:
seventh and eighth transistors connected as a differential pair having respective inputs and respective outputs;
a voltage source which provides a reference voltage $V_{ref}$;
a first one of said differential pair inputs coupled to $V_{ref}$;
a capacitor coupled to the second of said differential pair inputs,
said differential pair producing first and second output currents coupled to the voltages driving said third and fourth FETs, respectively; and
a switching network arranged to operate said IA in an auto-zero mode and a normal mode, said switching network when in said auto-zero mode arranged to:
connect said first and second input terminals together; and
couple said second differential pair input to said current output terminal;
said differential pair arranged to force the voltage at said current output terminal to $V_{ref}$, the voltage required at said second differential pair input to do so stored on said capacitor;
said switching network when in said normal mode arranged to:
uncouple said second differential pair input from said current output terminal and disconnect said first input terminal from said second input terminal such that $I_{DC1}$ and $I_{DC2}$ vary with VINP−VINN;

said IA arranged such that when VINP=VINN, $I_{DC1}=I_{DC2}\pm I_{error}$, where $I_{error}$ arises due to mismatches between said first and second buffer amplifiers and/or said $I_a$ coupling circuitry and said $I_b$ coupling circuitry;

said voltage stored on said capacitor maintaining the voltage at said current output terminal at $\sim V_{ref}$ when said IA is operating in normal mode such that the magnitude of $I_{error}$ is less than it would be without said stored voltage.

12. The IA of claim 11, further comprising a buffer amplifier having first and second inputs and an output, said buffer amplifier coupled to $V_{ref}$ at said first input, said switching network further arranged to:
couple said second differential pair input to said current output terminal during said normal mode such that said buffer amplifier provides an output voltage $V_{out}$ which varies with $I_{out}$; and uncouple said second differential pair input from said current output terminal during said auto-zero mode.

13. A method of reducing error components in a current-mode instrumentation amplifier (IA), comprising:
- receiving a differential voltage (VINP−VINN);
- buffering said differential voltage and providing first and second output voltages V1 and V2 which vary with VINP and VINN, respectively;
- connecting a resistance between V1 and V2 such that said resistance conducts a current $I_{R1}$ which varies with V1-V2;
- providing a DC output current $I_{DC1}$ which varies with V1 and $I_{R1}$;
- providing a DC output current $I_{DC2}$ which varies with V2 and $I_{R1}$, said IA arranged such that when VINP=VINN, $I_{DC1}=I_{DC2}\pm I_{error}$;
- performing an auto-zero process comprising:
  - forcing VINP to be equal to VINN; and
  - generating a correction current which forces $I_{DC1}=I_{DC2}$ while VINP=VINN; and
- continuing to generate said correction current after said auto-zero process is completed such that the magnitude of $I_{error}$ is less than it would be without said correction current.

* * * * *